US012772814B2

(12) United States Patent
Mendoza-Gutierrez et al.

(10) Patent No.: US 12,772,814 B2
(45) Date of Patent: Oct. 20, 2026

(54) METHOD OF FORMING A METAL LINER FOR INTERCONNECT STRUCTURES

(71) Applicant: Applied Materials, Inc., Santa Clara, CA (US)

(72) Inventors: Jesus Candelario Mendoza-Gutierrez, San Jose, CA (US); Aaron Dangerfield, San Jose, CA (US); Bhaskar Jyoti Bhuyan, San Jose, CA (US); Mark Saly, Santa Clara, CA (US); Yang Zhou, Milpitas, CA (US); Yong Jin Kim, Albany, CA (US); Carmen Leal Cervantes, Mountain View, CA (US); Ge Qu, Sunnyvale, CA (US); Zhiyuan Wu, San Jose, CA (US); Feng Chen, San Jose, CA (US); Kevin Kashefi, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 607 days.

(21) Appl. No.: 18/131,956

(22) Filed: Apr. 7, 2023

(65) Prior Publication Data

US 2024/0339358 A1 Oct. 10, 2024

(51) Int. Cl.
*C23C 16/04* (2006.01)
*C23C 16/18* (2006.01)
(Continued)

(52) U.S. Cl.
CPC .......... *H10W 20/035* (2026.01); *C23C 16/04* (2013.01); *C23C 16/18* (2013.01);
(Continued)

(58) Field of Classification Search
None
See application file for complete search history.

(56) References Cited

U.S. PATENT DOCUMENTS 6,350,687 B1 2/2002 Avanzino et al.
9,677,172 B2 6/2017 Ha et al.
(Continued)

FOREIGN PATENT DOCUMENTS

JP 2016086145 A 5/2016
KR 20120037653 A 4/2012
(Continued)

OTHER PUBLICATIONS

Chen, Xi, et al., "Divide and Protect: Passivating Cu(111) by Cu-(benzotriazole)2", The Journal of Physical Chemistry 2012, 116, Oct. 5, 2012, 222346-22349.
(Continued)

*Primary Examiner* — David P Turocy
(74) *Attorney, Agent, or Firm* — Servilla Whitney LLC

(57) ABSTRACT

Methods of forming devices comprise forming a dielectric layer on a substrate, the dielectric layer comprising at least one feature defining a gap including sidewalls and a bottom. The methods include selectively depositing a self-assembled monolayer (SAM) on the bottom of the gap. The SAM has a general formula I to XXIII, wherein R, R', $R_1$, $R_2$, $R_3$, $R_4$, and $R_5$ are independently selected from hydrogen (H), hydroxy, carbonyl, amino, aminoalkyl, alkyl, alkene, alkyne, and aryl, n is from 0 to 20, m is from 0 to 20, x is from 1 to 2, and y is from 1 to 2. A barrier layer is formed on the SAM before selectively depositing a metal liner on the barrier layer. The SAM is removed after selectively depositing the metal liner on the barrier layer.

15 Claims, 8 Drawing Sheets

(51) Int. Cl.
*C23C 16/455* (2006.01)
*C23C 16/56* (2006.01)
*H10W 20/00* (2026.01)

(52) U.S. Cl.
CPC ........ *C23C 16/45527* (2013.01); *C23C 16/56* (2013.01); *H10W 20/056* (2026.01)

(56) References Cited

U.S. PATENT DOCUMENTS

| | | | | |
|---|---|---|---|---|
| 10,867,905 | B2 | 12/2020 | Wang et al. | |
| 10,879,107 | B2 * | 12/2020 | Dutta | H10W 20/084 |
| 12,211,743 | B2 * | 1/2025 | Qu | H10W 20/035 |
| 2002/0041028 | A1 | 4/2002 | Choi et al. | |
| 2006/0128142 | A1 * | 6/2006 | Whelan | H10W 20/076 257/E21.171 |
| 2006/0128150 | A1 | 6/2006 | Gandikota et al. | |
| 2009/0032766 | A1 | 2/2009 | Rajaratnam et al. | |
| 2009/0104787 | A1 | 4/2009 | Ohmi et al. | |
| 2009/0215269 | A1 | 8/2009 | Boggs et al. | |
| 2009/0218693 | A1 | 9/2009 | Lee | |
| 2011/0244680 | A1 | 10/2011 | Tohnoe et al. | |
| 2012/0052681 | A1 | 3/2012 | Marsh | |
| 2012/0077342 | A1 | 3/2012 | Gao et al. | |
| 2014/0061855 | A1 | 3/2014 | Kuo et al. | |
| 2016/0190060 | A1 | 6/2016 | Bristol et al. | |
| 2016/0240433 | A1 * | 8/2016 | Ishizaka | H10P 14/43 |
| 2017/0162511 | A1 | 6/2017 | Ren et al. | |
| 2017/0323781 | A1 | 11/2017 | Kachian et al. | |
| 2018/0061628 | A1 | 3/2018 | Ou | |
| 2018/0082942 | A1 * | 3/2018 | Chawla | H10W 20/076 |
| 2018/0233350 | A1 | 8/2018 | Tois et al. | |
| 2020/0157680 | A1 * | 5/2020 | Chen | C23C 16/06 |
| 2020/0234943 | A1 * | 7/2020 | Bhuyan | H10P 14/69433 |
| 2020/0321247 | A1 | 10/2020 | Chen et al. | |
| 2020/0350204 | A1 * | 11/2020 | Yu | C23C 16/04 |
| 2021/0391275 | A1 * | 12/2021 | Kuo | H10P 14/432 |
| 2022/0028795 | A1 * | 1/2022 | Xu | H10W 20/035 |
| 2022/0246534 | A1 * | 8/2022 | Chin | H10W 20/425 |
| 2022/0275501 | A1 | 9/2022 | Cervantes et al. | |

FOREIGN PATENT DOCUMENTS

| | | | |
|---|---|---|---|
| WO | 2016175782 | A1 | 11/2016 |
| WO | 2019018379 | A1 | 1/2019 |
| WO | 2023033901 | A1 | 3/2023 |

OTHER PUBLICATIONS

Farm, Elina, et al., "Passivation of copper surfaces for selective-area ALD using a thiol self-assembled monolayer", Semiconductor Science and Technology 27 (2012) 074004, Jun. 22, 2012, 5 pages.
Kokalj, Anton, et al., "Density Functional Theory Study of ATA, BTAH, and BTAOH as Copper Corrosion Inhibitors: Adsorption onto Cu(111) from Gas Phase", Langmuir 2010, 26 (18), Aug. 23, 2010, 14582-14593.
Kokalj, Anton, et al., "The Effect of Surface Geometry of Copper on Dehydrogenation of Benzotriazole. Part II", The Journal of Physical Chemistry 2014, 188, Dec. 12, 2013, 944-954.
Kokalj, Anton, et al., "What Determines the Inhibition Effectiveness of ATA, BTAH, and BTAOH Corrosion Inhibitors on Copper?", Journal of the American Chemical Society 2010, 132, Oct. 29, 2010, 16657-16668.
Kuznetsov, Yu. I., et al., "Adsorption and passivation of copper by triazoles in neutral aqueous solution", Int. J. Corros. Scale Inhib., 2014, 3, No. 2,, Mar. 13, 2014, 137-148.
Peljhan, Sebastijan, et al., "The Effect of Surface Geometry of Copper on Adsorption of Benzotriazole and Cl. Part I", The Journal of Physical Chemistry 2014, 118, Dec. 12, 2013, 933-943.
Pena, Luis Fabian, et al., "Vapor-Phase Cleaning and Corrosion Inhibition of Copper Films by Ethanol and Heterocyclic Amines", American Chemical Society: Applied Materials & Interfaces 2018, 10, Oct. 18, 2018, 38610-38620.
Sau, Samaresh Chandra, et al., "An Abnormal N-Heterocyclic Carbene-Copper(I) Complex in Click Chemistry", Ad. Synth. Catal. 2013, 355, 2982-2991.
Tasca, Elena, et al., "Micellar promoted multi-component synthesis of 1,2,3-triazoles in water at room temperature" Green Chem., 2015, 17, 1414-1422.
Wang, Yizhen, et al., "Click-assembling triazole membrane on copper surface via one-step or two-steps and their corrosion inhibition performance", Applied Surface Science 427 (2018) 1120-1128.
"PCT International Search Report and Written Opinion in PCT/US2024/022126 dated Aug. 2, 2024, 10 pages".

* cited by examiner

METHOD OF FORMING A METAL LINER FOR INTERCONNECT STRUCTURES

TECHNICAL FIELD

Embodiments of the disclosure generally relate to methods of forming a metal liner for interconnect structures. More particularly, embodiments of the disclosure are directed to methods of selectively depositing a metal liner layer.

BACKGROUND

Multiple challenges impede power and performance improvements when scaling transistors and interconnects to the 3 nm node and beyond. Interconnects include metal lines that transfer current within the same device layer and metal vias that transfer current between layers. Pitch reduction narrows the width of both and increases resistance, and also increases the voltage drop across a circuit, throttling circuit speed and increasing power dissipation.

While transistor performance improves with scaling, the same cannot be said for interconnect metals. As dimensions shrink, interconnect via resistance can increase by a factor of 10. An increase in interconnect via resistance may result in resistive-capacitive (RC) delays that reduce performance and increase power consumption. A conventional copper interconnect structure includes a barrier layer and/or a metal liner deposited on the sidewalls of gap that provide a via the sidewalls made of a dielectric material, providing good adhesion, and preventing the copper from diffusing into the dielectric layer. Barrier layers can typically be the largest contributor to via resistance due to high resistivity. Past approaches have focused on reducing the thickness of barrier layers or finding barrier layers with lower resistivity to decrease via resistance. Increased via resistance remains an issue, especially in smaller features when barrier layers on sidewalls form an increasing percentage of the via volume.

A metal liner deposited on a barrier layer adheres to the barrier layer and facilitates subsequent copper (Cu) fill in a gap between the sidewalls. Current approaches focus on selectively growing a metal liner on a via sidewall versus the via bottom with high selectivity in an attempt to reduce via resistance and Cu corrosion, though selective growth remains a challenge.

Accordingly, there is a need for methods for depositing material layers that improve performance of interconnects, for example, reducing via resistance and improving deposition selectivity.

SUMMARY

Embodiments of the disclosure are directed to methods of forming a microelectronic device. In one or more embodiments, the method comprises: forming a dielectric layer on a substrate, the dielectric layer comprising at least one feature defining a gap including sidewalls and a bottom; selectively depositing a self-assembled monolayer (SAM) on the bottom of the gap, the SAM having a general formula I to XIX, wherein R, R', $R_1$, $R_2$, $R_3$, $R_4$, and $R_5$ are independently selected from hydrogen (H), alkyl, alkene, alkyne, and aryl, n is from 1 to 20, m is from 1 to 20, x is from 1 to 2, and y is from 1 to 2:

(I)

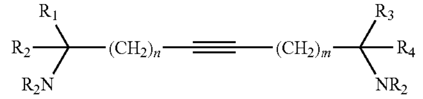

(II)

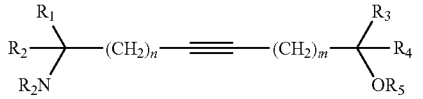

(III)

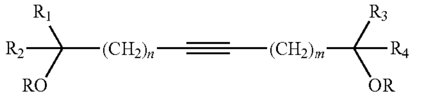

(IV)

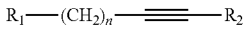

(V)

(VI)

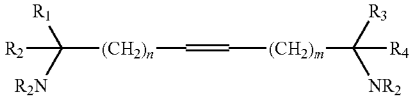

(VII)

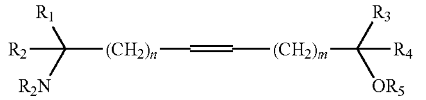

(VIII)

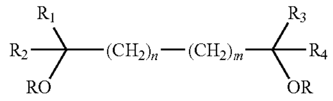

(IX)

N≡C—R C≡N—R (X)

$R_1$—N=C=N—$R_2$ (XI)

$R_2N$—$(CH_2)n$—OR'

(XII)

—$(CH_2)n$—$NR_2$ (XIII)

$R_1$—S—$R_2$ (XIV)

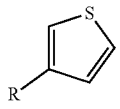

(XV)

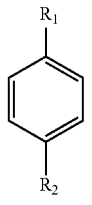

(XVI)

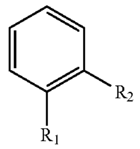

(XVII)

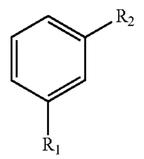

-continued (XVIII)

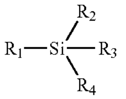

(XIX)

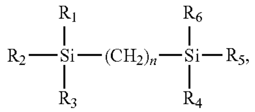

aniline, pyrazole, 3,5-dimethyl pyrazole, 1-dimethylamino-2-pentyne, N-ethylenediamine, 3-hexyn-2-ol, 4-hexen-3-one, 3,5-dimethyl-3-hexyne-2,5-diol, 2-methyloct-3-yn-2-ol, catechol, 2,2'-bipyridyl, 2,4,7,9-tetramethyl-5-decyne-4,7-diol, 2,5-dimethyl-hexane-2,5-diol, 2-(ethylamino) ethanol, 4-Diethylamino-2-butyn-1-ol, dimethyl acetylenedicarboxylate, N,N,N',N'-tetraethyl ethylenediamine, N,N'-diisopropylcarbodiimide, 3-Hexyl Thiophene, Dibutyl sulfide, N,N,N',N'-Tetramethyl-2-butyne-2,4,diamine, N,N-diethyl-1,3-propanediamine, N,N,N',N'-tetramethyl ethylenediamine, N,N,N,N-tetramethyl-1,3-propanediamine, 1-Decyne, 1-Tetradecyne, 6-dodecyne, Dodecylsilane, N-octylsilane, phenylsilane, 1,4-disilabutane, diethylsilane, diisopropylsilane, phenyldimethylsilane, triethylsilane, Tert-butyldimethylsilane, pentamethyldiethylenetriamine, 1-octyne, 1-hexyne, Butyl isocyanide, and Butyl cyanide, forming a barrier layer on the SAM; selectively depositing a metal liner on the barrier layer on the sidewall, the metal liner being deposited at a thickness on the sidewalls that is greater than a thickness of the metal liner deposited on the bottom; removing the SAM after selectively depositing the metal liner on the barrier layer; and performing a gap fill process on the metal liner.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1A:
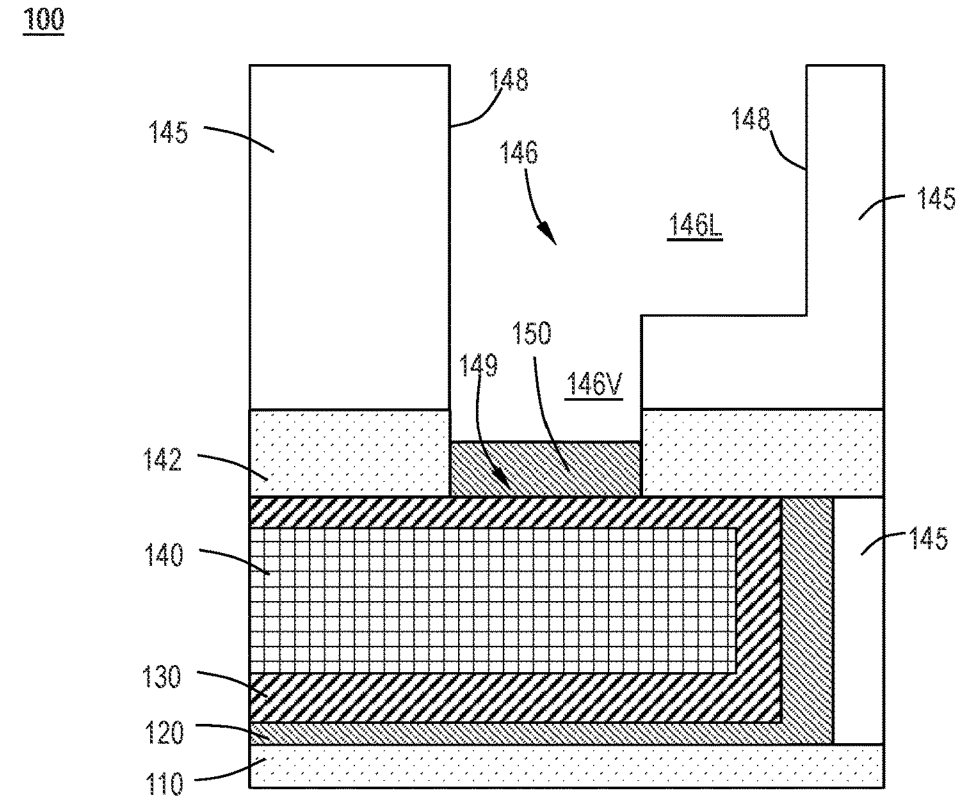
FIG. 1A illustrates a portion of a microelectronic device during a stage of manufacture with one or more embodiments of the disclosure having a passivation layer formed on a bottom of a gap.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Some embodiments of the disclosure provide methods for improving performance of interconnects. Interconnects comprise metal lines that transfer current within the same device layer, and metal vias that transfer current between layers. These lines and vias are formed with conductive metal such as copper or cobalt in gaps formed within the device. In one or more embodiments, a dielectric layer comprises at least one feature defining a gap including sidewalls and a bottom. In one or more embodiments, the gap comprises the metal lines and the metal vias. In one or more embodiments, the metal lines have a sidewall and a bottom. In one or more embodiments, the metal vias have a sidewall and a bottom. As used in this specification and the appended claims, unless specified otherwise, reference to the "bottom of the gap" is intended to mean the bottom of the metal via, which is nearest the substrate.

Embodiments of the disclosure provide methods of forming interconnect structures in the manufacture of microelectronic devices. In one or more embodiments, microelectronic devices described herein comprise at least one top interconnect structure that is interconnected to at least one bottom interconnect structure. Embodiments of the disclosure provide microelectronic devices and methods of manufacturing microelectronic devices that improve performance of interconnects, for example, reducing via resistance.

Figure 3:
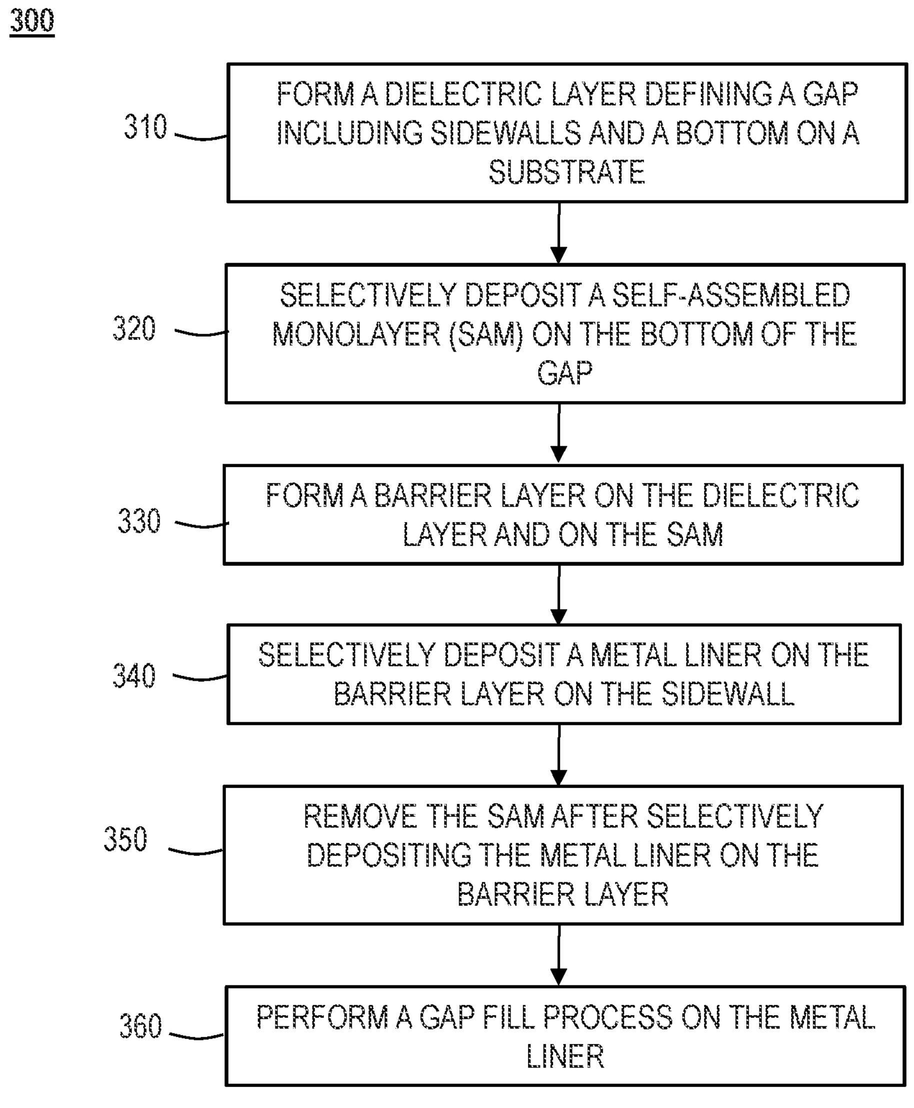
FIG. 3 illustrates a process flow diagram of a method of manufacturing a microelectronic device in accordance with one or more embodiments of the disclosure.
Figure 4:
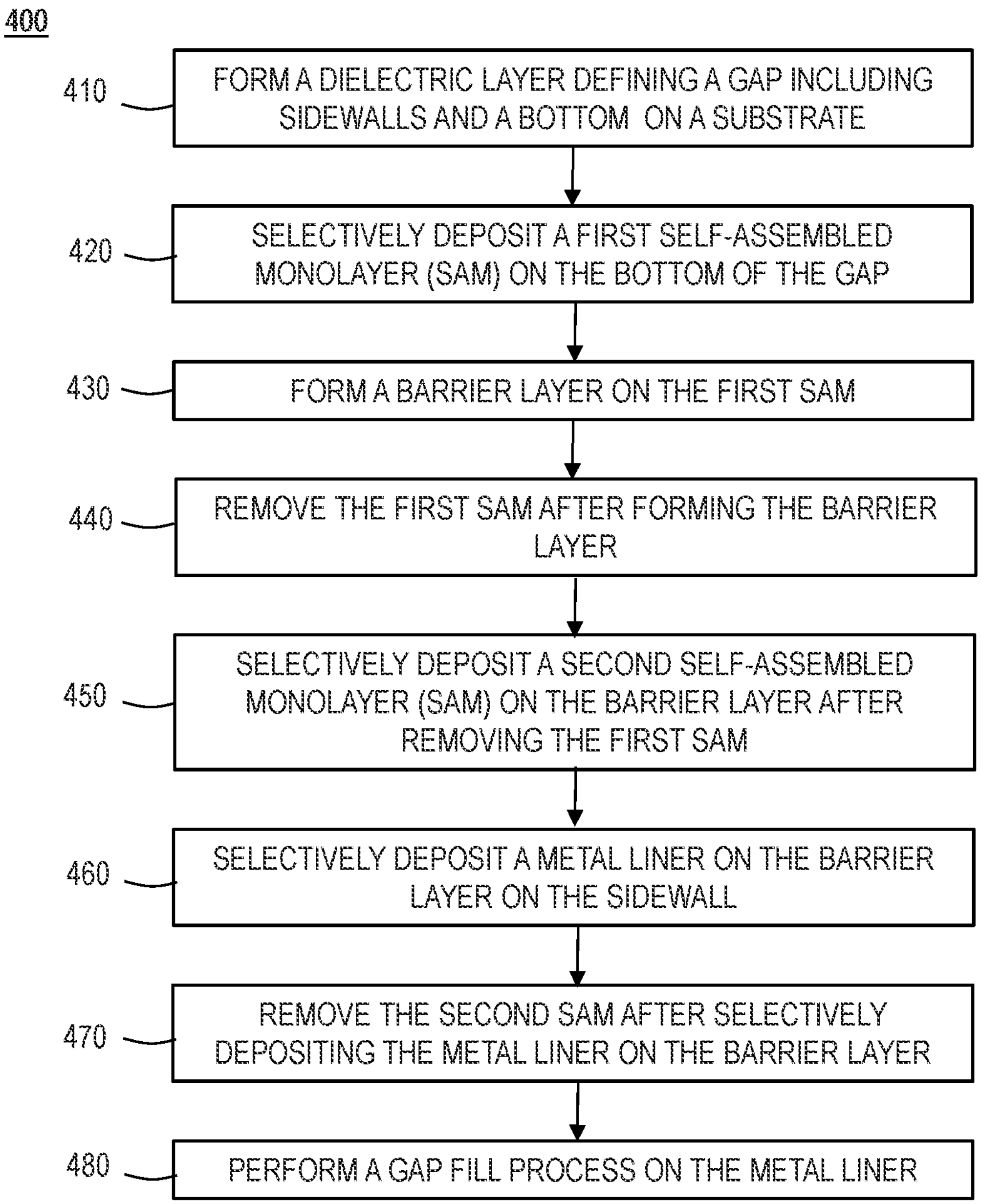
FIG. 4 illustrates a process flow diagram of a method of manufacturing a microelectronic device in accordance with one or more embodiments of the disclosure.

Methods of forming microelectronic devices are described herein with reference to FIGS. 1A-1E and FIGS. 2A-2G. FIG. 3 is a process flow diagram of an exemplary method of forming microelectronic devices with respect to FIGS. 1A-1E. FIG. 4 is a process flow diagram of an exemplary method of forming microelectronic devices with respect to FIGS. 2A-2G.

Referring to FIGS. 1A-1D, a portion of a microelectronic device 100 is shown during stages of manufacture. In FIG. 1A, the microelectronic device 100 comprises a substrate 110, a barrier layer 120 on the substrate 110, a metal layer 130 on the barrier layer 120, a conductive filled gap 140, an aluminum oxide etch stop layer 142, a dielectric layer 145 on the aluminum oxide etch stop layer 142, the dielectric layer 145 comprising at least one feature defining a gap 146 including sidewalls 148 and a bottom 149. According to one or more embodiments, a passivation layer (e.g., a self-assembled monolayer (SAM)) 150 is formed on the bottom 149 of the gap. It will be appreciated that in one or more embodiments, the conductive filled gap 140 forms a metal line that transfers current within the same device layer.

In one or more embodiments, the substrate 110 is a wafer, for example a semiconductor substrate. In one or more embodiments, the substrate 110 is an etch stop layer on a wafer. In one or more embodiments, the substrate 110 is an aluminum oxide etch stop layer on a wafer. In one or more embodiments, the barrier layer 120 comprises tantalum nitride (TaN). In one or more embodiments, the barrier layer 120 comprises tantalum nitride (TaN) formed by ALD. In one or more embodiments, the metal layer 130 comprises one or more of ruthenium (Ru), cobalt (cobalt), molybdenum (Mo), or tantalum (Ta). In one or more embodiments, the metal layer 130 comprises one or more of a single layer of ruthenium (Ru) or a single layer of cobalt (Co). In one or more embodiments, a portion of the metal layer 130 is etched. In one or more embodiments, a SAM 150 is deposited on the portion of the metal layer 130 that is etched. In one or more embodiments, the conductive filled gap 140 comprises one or more of copper (Cu) or cobalt (Co). In one or more embodiments, the etch stop layer 142 comprises one or more of aluminum oxide, silicon nitride and aluminum nitride.

In one or more embodiments, the dielectric layer 145 is a low-k dielectric layer. In certain embodiments, the dielectric layer 145 comprises silicon oxide ($SiO_x$). In one or more embodiments, the dielectric layer 145 comprises $SiO_xH_y(CH_z)$. Further embodiments provide that the dielectric layer 145 comprises porous or carbon-doped $SiO_x$. In some embodiments, the dielectric layer 145 is a porous or carbon-doped $SiO_x$ layer with a k value less than about 5. In other embodiments, the dielectric layer 145 is a multilayer structure. For example, in one or more embodiments, the dielectric layer 145 comprises a multilayer structure having one or more of a dielectric layer, an etch stop layer, and a hard mask layer.

In one or more embodiments, the dielectric layer 145 comprises at least one feature defining a gap 146 including sidewalls 148 and a bottom 149. The Figures show substrates having a single feature for illustrative purposes; however, those skilled in the art will understand that there can be more than one feature. The shape of the feature can be any suitable shape including, but not limited to, trenches, cylindrical vias that, when filled with metal, transfer current between layers, and lines that transfer current within the same device layer. In some embodiments, the feature defines a gap 146 in the dielectric layer 145. The gap 146 in some embodiments defines a via portion 146V and a line portion 146L, but the embodiments shown are not intended to be limiting. As used herein, the term "feature" means any intentional surface irregularity. Suitable examples of features include but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

In one or more embodiments, the SAM 150 is formed on the metal layer 130. In one or more embodiments, the SAM 150 is deposited by exposing the bottom 149 of the gap to a hydrocarbon carried in argon (Ar) gas.

In one or more embodiments, the SAM 150 has a general formula I to XIX, wherein R, R', $R_1$, $R_2$, $R_3$, $R_4$, and $R_5$ are independently selected from hydrogen (H), alkyl, alkene, alkyne, and aryl, n is from 1 to 20, m is from 1 to 20, x is from 1 to 2, and y is from 1 to 2:

(I)

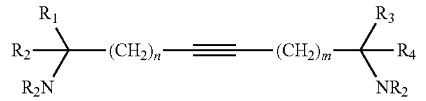

(II)

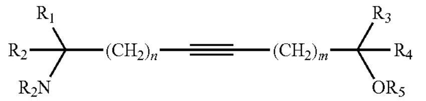

(III)

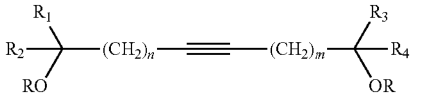

(IV)

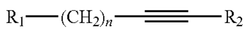

(V)

-continued (VI)

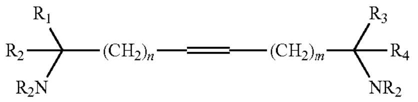

(VII)

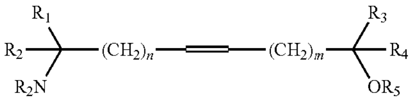

(VIII)

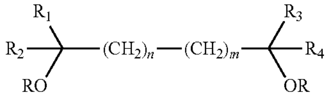

(IX)

$N{\equiv}C-R \quad C{\equiv}N-R$ (X)

$R_1-N{=}C{=}N-R_2$ (XI)

$R_2N-(CH_2)n-OR'$ (XII)

$-(CH_2)n-NR_2$ (XIII)

$R_1-S-R_2$ (XIV)

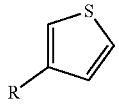

(XV)

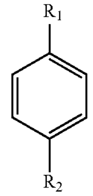

(XVI)

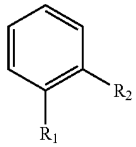

(XVII)

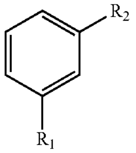

(XVIII)

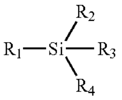

(XIX)

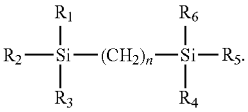

In one or more embodiments, was discovered that use of an SAM 150 improved Cu interconnect via resistance by minimizing via bottom metal liner growth with selective deposition of a metal liner on via sidewall rather than via bottom. Embodiments of the disclosure provide methods to selectively grow a metal liner such a Ru liner on via sidewall versus the via bottom with high selectivity (e.g., the ratio of the sidewall liner thickness to bottom liner thickness is greater than 3, greater than 4, greater than 5, greater than 6, greater than 7, greater than 8, greater than 9 or greater than 10). Selection of SAM chemistry and a process enables metal (e.g., Ru) nucleation and growth only at via sidewall, not on the via bottom. Thinner or no metal (e.g., Ru) growth on via bottom reduces via resistance and Cu corrosion. Other liner materials include cobalt (Co), molybdenum (Mo), and tantalum (Ta). In specific embodiments, a SAM chemistry/process which can suppress metal liner growth at the via bottom (for example, less than 10 Angstroms, less than 5 Angstroms, less than 4 Angstroms, less than 3 Angstroms, less than 2 Angstroms or less than 1 Angstrom) and maintain metal liner growth at via sidewall (for example, 5 Angstroms or greater or 10 Angstroms or greater). The SAM chemistry facilitates achievement of selectivity on via bottom (e.g., Cu, Co, W) versus the via sidewall (e.g., TaN).

According to one or more embodiments, selectively depositing the SAM comprises exposing the bottom 149 of the gap 146 to a hydrocarbon having a general formula I to XIX, wherein R, R', $R_1$, $R_2$, $R_3$, $R_4$, and $R_5$ are independently selected from hydrogen (H), alkyl, alkene, alkyne, and aryl, n is from 1 to 20, m is from 1 to 20, x is from 1 to 2, and y is from 1 to 2:

(I)

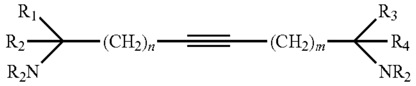

(II)

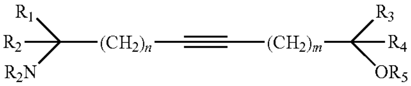

(III)

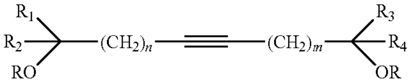

(IV)

$R_1-(CH_2)_n-{\equiv}-R_2$ (V)

$R_1-(CH_2)_n-{\equiv}-(CH_2)_m-R_2$ (VI)

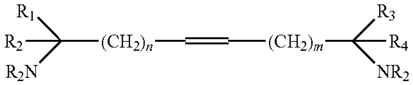

(VII)

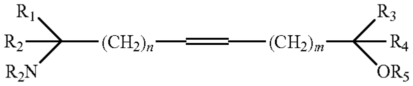

(VIII)

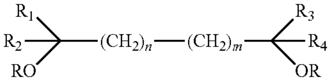

(IX)

$N{\equiv}C-R \quad C{\equiv}N-R$ (X)

$R_1-N{=}C{=}N-R_2$ (XI)

$R_2N-(CH_2)n-OR'$ (XII)

$-(CH_2)n-NR_2$ (XIII)

$R_1-S-R_2$ (XIV)

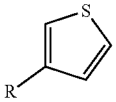

-continued (XV)

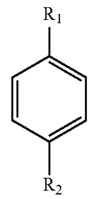

(XVI)

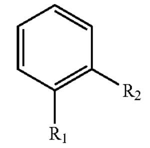

(XVII)

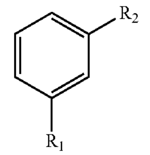

(XVIII)

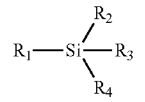

(XIX)

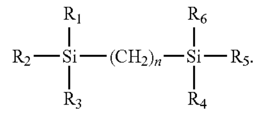

In one or more embodiments, the alkyl, alkene, and alkyne independently comprise from 1 to 10 carbon atoms.

Unless otherwise indicated, the term "lower alkyl," "alkyl," or "alk" as used herein alone or as part of another group includes both straight and branched chain hydrocarbons, containing 1 to 20 carbons, or 1 to 10 carbon atoms, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. The alkyl may be substituted or unsubstituted.

Such alkyl groups may optionally include up to 1 to 4 substituents such as halo, for example F, Br, Cl, or I, or $CF_3$, alkyl, alkoxy, aryl, aryloxy, aryl(aryl) or diaryl, arylalkyl, arylalkyloxy, alkenyl, cycloalkyl, cycloalkylalkyl, cycloalkylalkyloxy, amino, hydroxy, hydroxyalkyl, acyl, heteroaryl, heteroaryloxy, heteroarylalkyl, heteroarylalkoxy, aryloxyalkyl, alkylthio, arylalkylthio, aryloxyaryl, alkylamido, alkanoylamino, arylcarbonylamino, nitro, cyano, thiol, haloalkyl, trihaloalkyl, and/or alkylthio, and the like. In one or more embodiments, As used herein, the term "alkene" or "alkenyl" or "lower alkenyl" refers to straight or branched chain radicals of 2 to 20 carbons, or 2 to 12 carbons, and 1 to 8 carbons in the normal chain, which include one to six double bonds in the normal chain, such as vinyl, 2-propenyl, 3-butenyl, 2-butenyl, 4-pentenyl, 3-pentenyl, 2-hexenyl, 3-hexenyl, 2-heptenyl, 3-heptenyl, 4-heptenyl, 3-octenyl, 3-nonenyl, 4-decenyl, 3-undecenyl, 4-dodecenyl, 4,8,12-tetradecatrienyl, and the like, and which may be optionally substituted with 1 to 4 substituents, namely, halogen, haloalkyl, alkyl, alkoxy, alkenyl, alkynyl, aryl, arylalkyl, cycloalkyl, amino, hydroxy, heteroaryl, cycloheteroalkyl, alkanoylamino, alkylamido, arylcarbonyl-amino, nitro, cyano, thiol, alkylthio, and/or any of the alkyl substituents set out herein.

As used herein, the term "alkynyl" or "lower alkynyl" refers to straight or branched chain radicals of 2 to 20 carbons, or 2 to 12 carbons, or 2 to 8 carbons in the normal chain, which include one triple bond in the normal chain, such as 2-propynyl, 3-butynyl, 2-butynyl, 4-pentynyl, 3-pentynyl, 2-hexynyl, 3-hexynyl, 2-heptynyl, 3-heptynyl, 4-heptynyl, 3-octynyl, 3-nonynyl, 4-decynyl, 3-undecynyl, 4-dodecynyl, and the like, and which may be optionally substituted with 1 to 4 substituents, namely, halogen, haloalkyl, alkyl, alkoxy, alkenyl, alkynyl, aryl, arylalkyl, cycloalkyl, amino, heteroaryl, cycloheteroalkyl, hydroxy, alkanoylamino, alkylamido, arylcarbonylamino, nitro, cyano, thiol, and/or alkylthio, and/or any of the alkyl substituents set out herein.

The term "halogen" or "halo" as used herein alone or as part of another group refers to chlorine, bromine, fluorine, and iodine as well as $CF_3$.

As used herein, the term "aryl" refers to monocyclic and bicyclic aromatic groups containing 6 to 10 carbons in the ring portion (such as phenyl, biphenyl or naphthyl, including 1-naphthyl and 2-naphthyl) and may optionally include 1 to 3 additional rings fused to a carbocyclic ring or a heterocyclic ring (such as aryl, cycloalkyl, heteroaryl, or cycloheteroalkyl rings). The aryl group may be optionally substituted through available carbon atoms with 1, 2, or 3 substituents, for example, hydrogen, halo, haloalkyl, alkyl, haloalkyl, alkoxy, haloalkoxy, alkenyl, trifluoromethyl, trifluoromethoxy, alkynyl, and the like.

In one or more specific embodiments, the SAM has a general formula I to XIX and is selected from the group consisting of aniline, pyrazole, 3,5-dimethyl pyrazole, 1-dimethylamino-2-pentyne, N-ethylenediamine, 3-hexyn-2-ol, 4-hexen-3-one, 3,5-dimethyl-3-hexyne-2,5-diol, 2-methyl-oct-3-yn-2-ol, catechol, 2,2'-bipyridyl, 2,4,7,9-tetramethyl-5-decyne-4,7-diol, 2,5-dimethyl-hexane-2,5-diol, 2-(ethylamino)ethanol, 4-diethylamino-2-butyn-1-ol, dimethyl acetylenedicarboxylate, N,N,N',N'-tetraethyl ethylenediamine, N,N'-diisopropylcarbodiimide, 3-Hexyl thiophene, dibutyl sulfide, N,N,N',N'-Tetramethyl-2-butyne-2,4,diamine, N,N-diethyl-1,3-propanediamine, N,N,N',N'-tetramethyl ethylenediamine, N,N,N,N-tetramethyl-1,3-propanediamine, 1-decyne, 1-tetradecyne, 6-dodecyne, dodecylsilane, N-octylsilane, phenylsilane, 1,4-disilabutane, diethylsilane, diisopropylsilane, phenyldimethylsilane, triethylsilane, tert-butyldimethylsilane, pentamethyldiethylenetriamine, 1-octyne, 1-hexyne, butyl isocyanide, and butyl cyanide.

In some embodiments, the substrate is soaked in a vapor of the SAM. In some embodiments, the processing conditions for exposing the substrate to the SAM may be controlled.

In some embodiments, the pressure of the processing chamber is controlled. The pressure of the processing chamber may be any suitable pressure for forming the blocking layer. In some embodiments, the pressure of the processing chamber is maintained at less than or equal to about 80 Torr, less than or equal to about 70 Torr, less than or equal to about 60 Torr, less than or equal to about 50 Torr, less than or equal to about 40 Torr, less than or equal to about 30 Torr, less than or equal to about 20 Torr, less than or equal to about 15 Torr, less than or equal to about 10 Torr, or less than or equal to about 5 Torr. In some embodiments, the pressure of the processing chamber is maintained at about 10 Torr, about 20 Torr, about 30 Torr, about 40 Torr, or about 50 Torr.

In one or more embodiments, a flow of argon (Ar) gas is configured to carry the SAM from a container to the processing chamber. In some embodiments, the flow rate of the argon (Ar) gas that is configured to carry the SAM into the processing chamber is controlled. The flow rate of the argon (Ar) gas may be any suitable flow rate for forming the passivation layer. In some embodiments, the flow rate of the argon (Ar) gas is in a range of about 50 sccm to about 100 sccm, or in a range of about 75 sccm to about 100 sccm. In one or more embodiments, the flow rate of the argon (Ar) gas is about 600 sccm. In some embodiments, the flow rate of the argon (Ar) gas is less than or equal to about 600 sccm, less than or equal to about 500 sccm, less than or equal to about 400 sccm, less than or equal to about 300 sccm, less than or equal to about 250 sccm, less than or equal to about 200 sccm, less than or equal to about 150 sccm, less than or equal to about 100 sccm, less than or equal to about 75 sccm, or less than or equal to about 50 sccm.

In some embodiments, the soak period, during which the SAM is exposed to the substrate, is controlled. The soak period may be any suitable period for forming the blocking layer. In some embodiments, the soak period is from 1 to 200 s, for example from 1 to 10 s, greater than or equal to about 10 s, greater than or equal to about 20 s, greater than or equal to about 30 s, greater than or equal to about 45 s, greater than or equal to about 60 s, greater than or equal to about 80 s, greater than or equal to about 120 s, greater than or equal to about 150 s, or greater than or equal to about 200 s. In some embodiments, the soak period is about 60 s. In some embodiments, the soak period is about 200 s.

In one or more embodiments, the SAM is in a liquid phase when the SAM is in a container, such as an ampoule or a cylinder, from which the SAM is delivered to the chamber in a carrier gas. In some embodiments, the SAM is in a saturated vapor phase in the container when the container has a pressure of about 0.1 torr. In one or more embodiments, the temperature of the container is lower than the temperature in the processing chamber. In one or more embodiments, a carrier gas such as argon (Ar) gas carries the saturated vapor phase SAM from the container to the processing chamber. In some embodiments, the temperature of the processing chamber is controlled during exposure to the SAM. The temperature of the processing chamber may also be referred to as the operating temperature. In some embodiments, the temperature of the processing chamber is in a range of about 150° C. to about 400° C., for example, 200° C. to about 300° C. In some embodiments, the temperature of the processing chamber is less than or equal to about 300° C., less than or equal to about 275° C., less than or equal to about 250° C., less than or equal to about 225° C., or less than or equal to about 200° C.

Figure 1B:
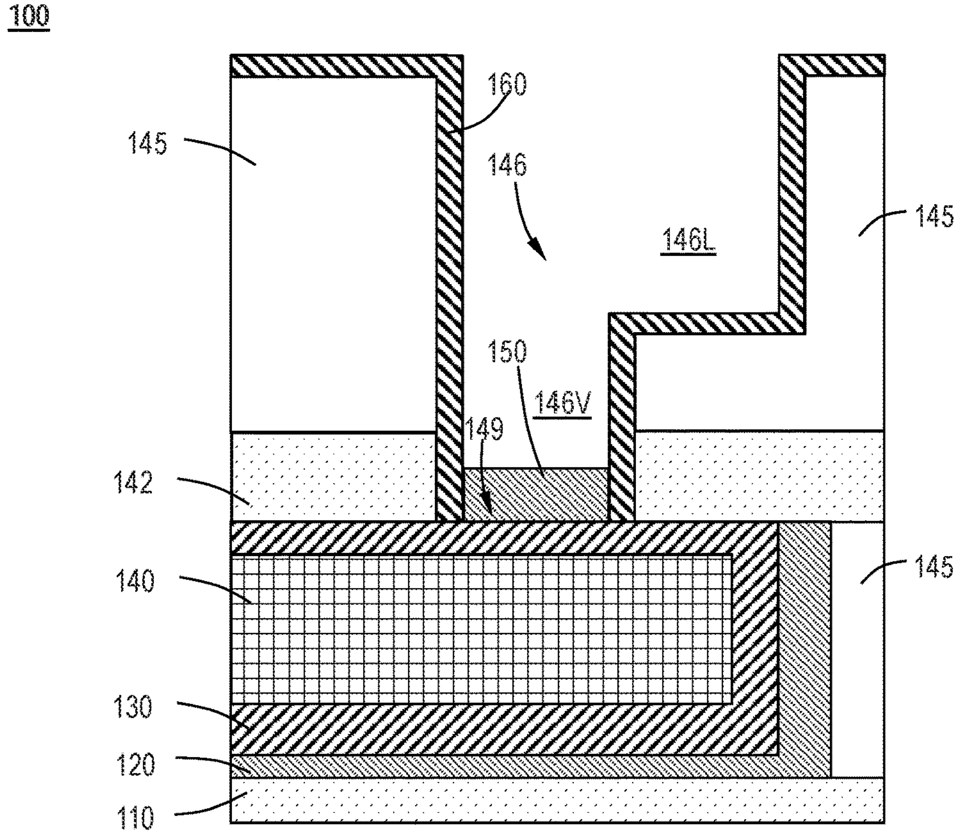
FIG. 1B illustrates a barrier layer formed after formation of the passivation layer shown in FIG. 1A.

Referring to FIG. 1B, a barrier layer 160 is shown on the SAM 150, over the sidewalls 148. In one or more embodiments, the barrier layer 160 has the same properties as the barrier layer 120. In one or more embodiments, the barrier layer 160 does not form on the bottom 149 of the gap 146. In one or more embodiments, when the SAM 150 is not present, the deposition of the barrier layer 160 is substantially conformal. In one or more embodiments where the SAM 150 is not present, the barrier layer 160 forms on the sidewalls 148, and the bottom 149 of the gap 146. As used herein, a layer which is "substantially conformal" refers to a layer where the thickness is about the same throughout (e.g., on the top, middle and bottom of sidewalls 148 and on the bottom 149 of the gap 146). A layer which is substantially conformal varies in thickness by less than or equal to about 5%, 2%, 1% or 0.5%. In one or more embodiments, the barrier layer 160 is selectively deposited on at least a portion of the sidewalls 148. In one or more unillustrated embodiments, the barrier layer 160 is selectively deposited on at least a portion of the bottom 149. In one or more embodiments, the barrier layer 160 may cover the entirety of the sidewalls 148.

In one or more embodiments, the barrier layer 160 is selectively deposited by atomic layer deposition (ALD), and has a thickness in a range of from about 2 Å to about 10 Å. In some embodiments, the barrier layer 160 is deposited in a single ALD cycle. In other embodiments, the barrier layer 160 is deposited in from 1 to 20 ALD cycles. In one or more embodiments, each cycle of the 1 to 20 ALD cycles is configured to deposit a thickness of about 0.5 Å of the barrier layer 160.

In one or more embodiments, when the barrier layer 160 formed on the bottom 149 and the sidewalls 148, there is a ratio of the thickness of the barrier layer 160 thickness on the sidewalls 148 to the thickness of the barrier layer 160 thickness on the bottom 149, the ratio being greater than 6. In one or more, the ratio is greater than 5, greater than 4, greater than 3, greater than 2, or greater than 1. In one or more embodiments, when the SAM 150 is present, the barrier layer 160 has a thickness in a range of from 5 Angstroms to 20 Angstroms on the sidewalls 148. In one or more embodiments, the barrier layer 160 has a thickness of less than or equal to 5 Angstroms on the bottom 149. In one or more embodiments, the barrier layer 160 has a thickness of less than or equal to 4 Angstroms, less than or equal to 3 Angstroms, less than or equal to 2 Angstroms, or less than or equal to 1 Angstrom on the bottom 149. In one or more embodiments, the barrier layer 160 does not form on the bottom 149.

Figure 1C:
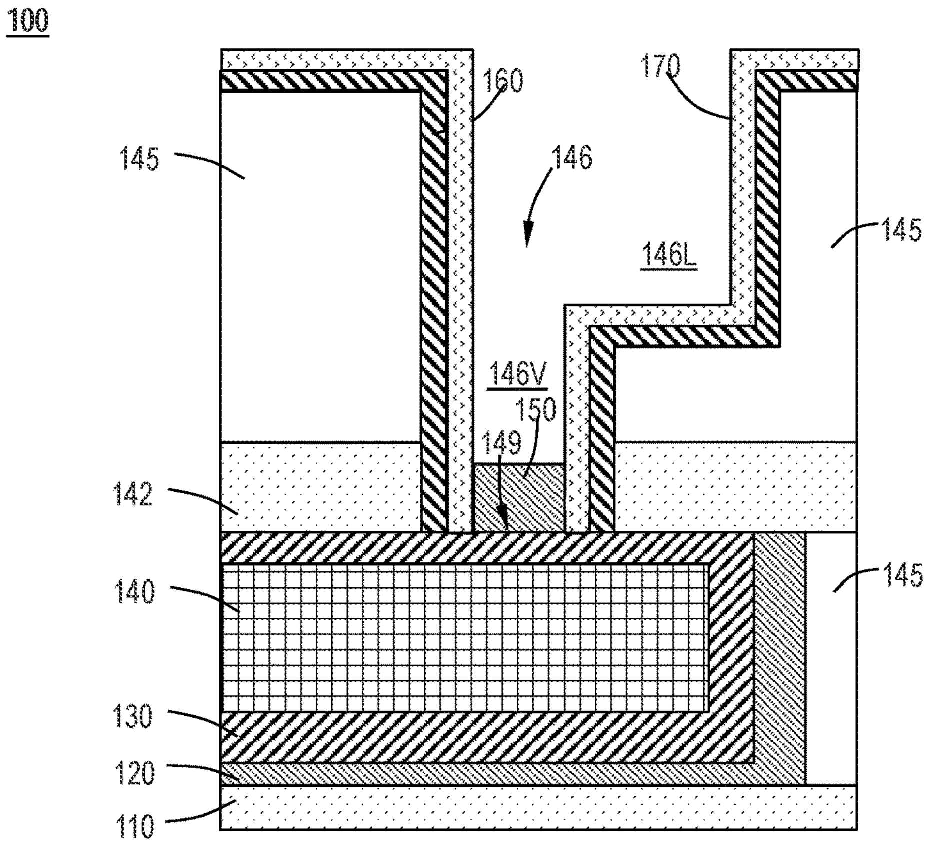
FIG. 1C illustrates a liner layer formed on the barrier layer formed in FIG. 1B.

Referring to FIG. 1C, a first metal liner 170 is shown on the barrier layer 160 shown in FIG. 1B. In one or more embodiments, the first metal liner 170 has the same properties as the metal layer 130. In one or more embodiments, the metal liner 170 is selectively deposited on the sidewalls 148 of the microelectronic device. In one or more embodiments, the first metal liner 170 comprises one or more of ruthenium (Ru), cobalt (cobalt), molybdenum (Mo), or tantalum (Ta). In one or more embodiments, the first metal liner 170 comprises one or more of a single layer of ruthenium (Ru) or a single layer of cobalt (Co). In one or more embodiments, the first metal liner 170 comprises a single layer of ruthenium (Ru). In one or more embodiments, the first metal liner 170 comprises the single layer of ruthenium (Ru) selectively deposited on the sidewall. In one or more embodiments, the first metal liner 170 comprises a multilayer film having a first liner film comprised of a first metal M1 and a second liner film comprised of a second metal M2. In one or more embodiments, the first metal liner 170 comprises the first metal M1 comprising ruthenium (Ru) and the second metal M2 comprising cobalt (Co).

Embodiments of the disclosure advantageously provide methods of forming microelectronic devices reduces a resistance of a via by at least 20% as compared to a resistance of a via in a microelectronic device where a metal liner is not selectively deposited. In one or more embodiments, the resistance of the vias of microelectronic devices described herein is reduced by at least 15%, at least 10% or at least 5% as compared to a resistance of a via in a microelectronic device where a metal liner is not selectively deposited.

Using typical deposition processes, ruthenium (Ru) is deposited on a sidewall and a bottom. It has been discovered that, when using known deposition processes for a time period of 40 seconds, a ruthenium (Ru) layer deposited on a sidewall has a thickness of 10 Angstroms, and a ruthenium (Ru) layer deposited on the bottom has a thickness of about 3.87 Angstroms. In one or more embodiments, a ratio of the thickness of the ruthenium (Ru) layer thickness on the sidewalls to the thickness of the ruthenium (Ru) layer thickness on the bottom is about 2.6.

It has been discovered that selectively depositing a single layer of ruthenium (Ru) according to embodiments of the methods described herein increases a ratio of the thickness of the metal liner thickness on the sidewalls to the thickness of the metal liner thickness on the bottom. In one or more embodiments, the thickness of the metal liner thickness on the sidewalls is greater than the thickness of the metal liner on the bottom.

In one or more embodiments, when the metal liner 170 comprises a single layer of ruthenium (Ru) selectively deposited on the sidewall 148, there is a ratio of the thickness of the metal liner thickness on the sidewalls 148 to the thickness of the metal liner 170 thickness on the bottom 149, the ratio being greater than 3. In one or more embodiments, the ratio of the thickness of the metal liner thickness on the sidewalls 148 to the thickness of the metal liner thickness on the bottom 149 is greater than 4, greater than 5, greater than 6 or greater than 7. In one or more embodiments, the metal liner 170 does not form on the bottom 149.

In one or more embodiments, when the metal liner 170 comprises a single layer of selectively deposited ruthenium (Ru), the metal liner 170 has a thickness in a range of from 5 Angstroms to 20 Angstroms on the sidewalls 148. In one or more embodiments, when the metal liner 170 comprises a single layer of selectively deposited ruthenium (Ru), the metal liner 170 has a thickness of less than or equal to 5 Angstroms on the bottom 149. In one or more embodiments, when the metal liner 170 comprises a single layer of selectively deposited ruthenium (Ru), the metal liner 170 has a thickness of less than or equal to 4 Angstroms, less than or equal to 3 Angstroms, less than or equal to 2 Angstroms, or less than or equal to 1 Angstrom on the bottom 149.

In one or more embodiments, the metal liner 170 comprising ruthenium (Ru) is selectively deposited by a selective ruthenium (Ru) deposition process. The selective ruthenium (Ru) deposition on the sidewall comprises a cyclic deposition process that includes a ruthenium deposition step using a ruthenium (Ru) precursor carried by a carrier gas such as an argon (Ar) gas. In one or more embodiments, the selective ruthenium (Ru) deposition further comprises an annealing or treatment step that is performed while flowing hydrogen ($H_2$) and optionally a second gas, for example, argon (Ar). In one or more embodiments, the selective ruthenium (Ru) deposition is performed in a substrate processing chamber in which the deposition step is performed while the chamber is at a first pressure, and the annealing step is performed while the substrate processing chamber at a second pressure that is greater than the first pressure. In one or more embodiments, the first pressure is in a range of from 1 torr to 5 torr. In some embodiments, the first pressure is in a range of from 1 torr to 4 torr, or a range of from 1 torr to 3 torr. In one or more embodiments, the second pressure is in a range of from 10 torr to 150 torr. In some embodiments, the second pressure is in a range of from 10 torr to 40 torr, or in a range of from 10 torr to 30 torr. Thus, according to one or more embodiments, a cyclic deposition process includes a deposition step and annealing/treatment step. In the deposition step, a ruthenium precursor (e.g., any suitable metalorganic precursor, for example, Cyclohexadienyl ruthenium tricarbonyl, $Ru_3(CO)_9$) is flowed in carrier gas and reactant gas (e.g., Ar and/or $H_2$) for 2-10 seconds, e.g., 3-6 seconds to form a deposited ruthenium layer. In the annealing or treatment step, the deposited ruthenium layer is annealed or treated in the presence of a flowing gas (e.g., >90% $H_2$ and a second gas such as Ar) for 30-90 seconds, for examples 40-70 seconds. This cyclic deposition processes comprising cycles of a deposition step and an annealing or treatment step is repeated multiple times to obtain a desired film thickness.

Figure 1D:
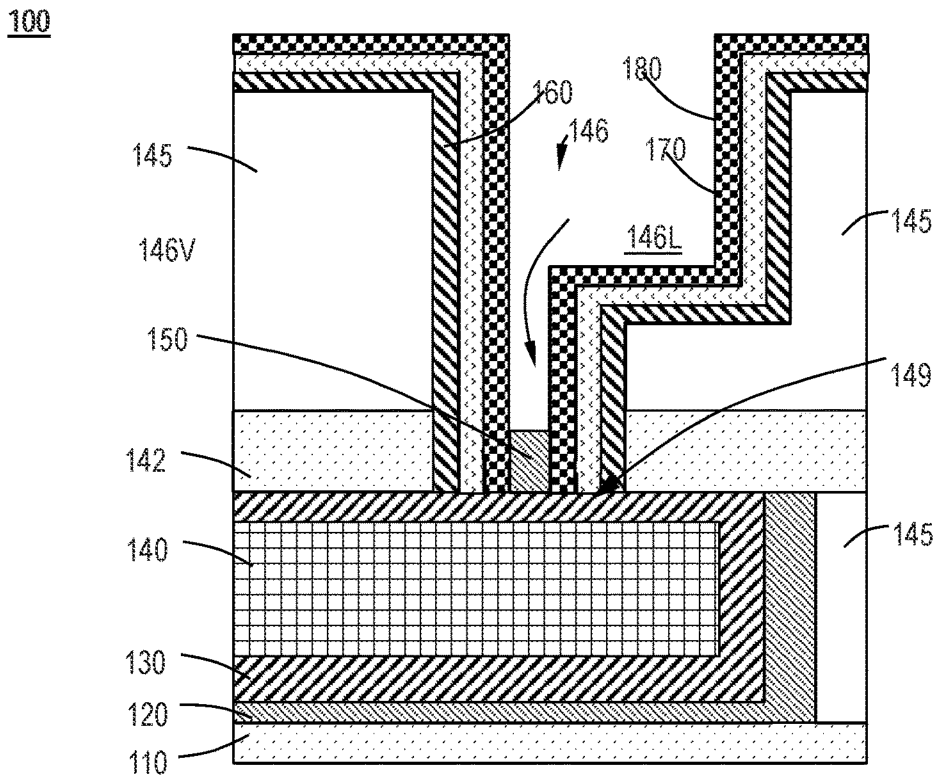
FIG. 1D illustrates a second liner layer formed on the liner layer formed in FIG. 1C.

Referring to FIG. 1D, in one or more embodiments an optional second metal liner 180 is shown on the first metal liner 170. In one or more embodiments, the second metal liner 180 comprises one or more of ruthenium (Ru), cobalt (cobalt), molybdenum (Mo), or tantalum (Ta). In one or more embodiments, the second metal liner 180 comprises one or more of a single layer of ruthenium (Ru) or a single layer of cobalt (Co). In one or more embodiments, the metal liner 180 comprises a single layer of cobalt (Co) deposited on the sidewall. In one or more embodiments, when the metal liner 180 comprises a single layer of deposited cobalt (Co), the metal liner 180 has a thickness in a range of from 5 Angstroms to 20 Angstroms on the sidewalls 148. In one or more embodiments, when the metal liner 180 comprises a single layer of deposited cobalt (Co), the metal liner 180 has a thickness of less than or equal to 5 Angstroms on the bottom 149. In one or more embodiments, when the metal liner 180 comprises a single layer of deposited cobalt (Co), the metal liner 180 has a thickness in a range of 5 Angstroms to 20 Angstroms on the bottom 149. In one or more embodiments, the second metal liner 180 does not form on the bottom 149.

In one or more embodiments, the second metal liner 180 comprises a multilayer film having a first liner film comprised of a first metal M1 and a second liner film comprised of a second metal M2. In one or more embodiments, the second metal liner 180 comprises the first metal M1 comprising ruthenium (Ru) and the second metal M2 comprising cobalt (Co). In one or more embodiments, when the second metal liner 180 comprises the first metal M1 comprising ruthenium (Ru) and the second metal M2 comprising cobalt (Co), the multilayer film has a combined thickness in a range of 10 to 20 Angstroms on the sidewalls 148. In one or more embodiments, when the second metal liner 180 comprises the first metal M1 comprising ruthenium (Ru) and the second metal M2 comprising cobalt (Co), the multilayer film has a combined thickness in a range of 5 to 20 Angstroms on the bottom 149.

In one or more embodiments, the microelectronic device 100 comprises one or more of the first metal liner 170 and the second metal liner 180. In one or more embodiments, the first metal liner 170 is the same as the second metal liner 180. In one or more embodiments, the first metal liner 170 is different than the second metal liner 180.

In some embodiments, a two-metal liner film comprises an alloy of the two metals in a single layer. In some embodiments, the two-metal liner film comprises alternating layers of the two metals M1 and M2, or a first metal liner film and a second metal liner film. In one or more embodiments, the two metals comprise two metals selected from the group consisting of (M1) Co and (M2) tantalum (Ta); (M1) Co and (M2) molybdenum (Mo); (M1) Ru and (M2) Ta; (M1) Ru and (M2) W; (M1) Ru and (M2) Mo; (M1) Co and (M2) Ru; and (M1) Ru and (M2) Co. In one or more embodiments, the two-metal liner film has a thickness of less than 20 Angstroms.

According to one or more embodiments, the two-metal liner film can be formed by various deposition methods, including alternating and/or co-flow precursors by ALD/CVD/PE-ALD, precursors with multi-metal ligands, dopant implanting, and or thermal diffusion. The two-metal liner film can be formed in a single processing chamber or in multiple processing chambers. In one or more embodiments, the two-metal liner film can be treated by various methods, including thermal treatment, plasma treatment and/or chemical treatment.

Advantageously, the two-metal liner films according to one or more embodiments, which are ultra-thin (e.g., having a thickness of 20 Angstroms or less), provide better interfacial adhesion and mobility between two metals such as a barrier layer and a gap fill metal. The two-metal liner films and methods described according to one or more embodiments, can be used in metal contact, interconnect, and capping applications. The two-metal liner films according to one or more embodiments are thinner than current liners, which are typically greater than 20 Angstroms and up to 30 Angstroms. In some embodiments, liner films comprised of two metals have a thickness in a range of from 10 Angstroms to 20 Angstroms, from 10 Angstroms to 19 Angstroms, 10 Angstroms to 18 Angstroms, 10 Angstroms to 17 Angstroms, 10 Angstroms to 16 Angstroms, 10 Angstroms to 15 Angstroms, 10 Angstroms to 14 Angstroms, 10 Angstroms to 13 Angstroms or 10 Angstroms to 12 Angstroms. The two-metal liner films described herein can extend the metal fill and capping to advance nodes, such as enabling Cu reflow in 3 nm/2 nm node, low resistivity in the middle of the line (MOL) and back end of line (BEOL), and memory. The methods described herein can also simplify the current complicated integration system to one chamber or multi chamber process involving CVD/ALD/PVD/PEALD/ion implantation.

In one or more embodiments, the barrier layer and/or metal film may be deposited via ALD. In a typical ALD process, alternating pulses or flows of "A" precursor and "B" precursor can be used to deposit a film. The alternating exposure of the surface to reactants "A" and "B" is continued until the desired thickness film is reached. However, instead of pulsing the reactants, the gases can flow simultaneously from one or more gas delivery head or nozzle and the substrate and/or gas delivery head can be moved such that the substrate is sequentially exposed to each of the reactive gases. Of course, the aforementioned ALD cycles are merely exemplary of a wide variety of ALD process cycles in which a deposited layer is formed by alternating layers of precursors and co-reactants.

In one or more embodiments, the co-reactants are in vapor or gas form. The reactants may be delivered with a carrier gas. A carrier gas, a purge gas, a deposition gas, or other process gas may contain nitrogen, hydrogen, argon, neon, helium, or combinations thereof. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

In one or more embodiments, the barrier layer material and liner film are deposited using a multi-chamber process with separation of the barrier layer material (e.g., tantalum nitride (TaN)) and the metal liner film. In other embodiments, a single chamber approach is used, with all processes occurring within one chamber and the different layers/films separated in processing by gas purges Some embodiments of the disclosure are directed to barrier applications, e.g., copper barrier applications. The barrier layer formed by one or more embodiments may be used as a copper barrier. Suitable barrier layers for copper barrier applications include, but are not limited to, TaN and MnN. For copper barrier applications, suitable dopants include, but are not limited to, Ru, Cu, Co, Mn, Al, Ta, Mo, Nb, V, or combinations thereof. A plasma treatment can be used after doping to promote the intermetallic compound formation between the matrix and dopant, as well as removing film impurities and improving the density of the barrier layer. In other embodiments, post treatment can include, but is not limited to, physical vapor deposition (PVD) treatment, thermal anneal, chemical enhancement, or the like. In some copper barrier applications, a high frequency plasma (defined as greater than about 14 MHz or about 40 MHz or greater) can be used with any inert gas, including, but not limited to, one or more of neon (Ne), hydrogen ($H_2$), and argon (Ar) gas. In one or more embodiments, to prevent low-k damage, a higher plasma frequency can be used (higher than 13.56 MHz). In some embodiments, the barrier layer is a copper barrier and comprises TaN doped with Ru.

Suitable precursors for depositing a liner layer include metal-containing precursors such as carbonyl-containing and cyclopentadiene-containing precursors. In a non-limiting example, if the liner layer is RuCo, the Ru-containing precursor may be triruthenium dodecacarbonyl $Ru_3(CO)_{12}$ and the Co-containing precursor may be dicobalt hexacarbonyl tertbutylacetylene (CCTBA). If the liner layer is TaRu, the Ta-containing precursor may be pentakis(dimethlamino) tantalum (PDMAT). Other suitable precursors are known to those skilled in the art. Organic species in organic-containing precursors for liner layers may get partially incorporated into the underlying layer (such as a barrier or dielectric layer), which may increase the adhesion at the liner layer-underlying layer interface.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

The metal liner film can be formed by depositing alternating layer two metals or co-reacting two metal precursors by CVD, PVD or ALD. Depending on the liner metals used, a co-reactants or co-precursors may be used to deposit the liner film. In one or more embodiments, ion implantation may be used for incorporating a second metal into a liner film comprised of a first metal. In other embodiments, physical vapor deposition (PVD) co-treatment may be used to add a second metal into the doped liner film formed over the barrier layer. In further embodiments, the liner film may be annealed inside an atmosphere comprising the second metal to thermally diffuse the second metal into the liner film of the first metal to form a liner film over the barrier layer.

In one or more embodiments, PVD treatment with sputtering can be used to incorporate the optional second metal into a liner film comprising the first metal. For example, PVD treatment with cobalt (Co) can inject Co into a ruthenium film to form a liner film comprising ruthenium and cobalt.

In some embodiments, instead of or in addition to using a co-reactant, a post-plasma treatment step may be used after exposing the liner film comprising the first metal to the optional second metal precursor. According to one or more embodiments, the plasma comprises any suitable inert gas known to the skilled artisan. In one or more embodiments, the plasma comprises one or more of helium (He), argon (Ar), ammonia ($NH_3$), hydrogen ($H_2$), and nitrogen ($N_2$). In some embodiments, the plasma may comprise a mixture of Ar and $H_2$, such as a mixture having an Ar:$H_2$ molar ratio in the range from 1:1 to 1:15. The plasma power may be in the range from about 200 to about 1000 Watts. The plasma frequency may be in the range from 350 kHz to 40 MHz. The plasma treatment time may vary from 5 second to 60 seconds, such as in the range from 10 seconds to 30 seconds. In some embodiments, the pressure during plasma treatment may be in the range from 0.5 to 50 Torr, such as from 1 to 10 Torr. In some embodiments, the wafer spacing may be in the range from 100 mils to 600 mils.

In one or more embodiments, the liner film comprising the first metal may be exposed to the second metal precursor during deposition, i.e., the second metal precursor may be used sequentially in an ALD cycle to provide a liner film comprised of two metals on the barrier layer. In various embodiments, the duration of the exposure to the second metal-containing precursor may range from 1 to 60 seconds, such as in the range from 3 to 30 seconds or from 5 to 10 seconds. Longer exposures to the second metal precursor will increase the amount of second metal in the two-metal liner film. In one or more embodiments, the two-metal liner film is formed by a cyclic deposition process.

Figure 1E:
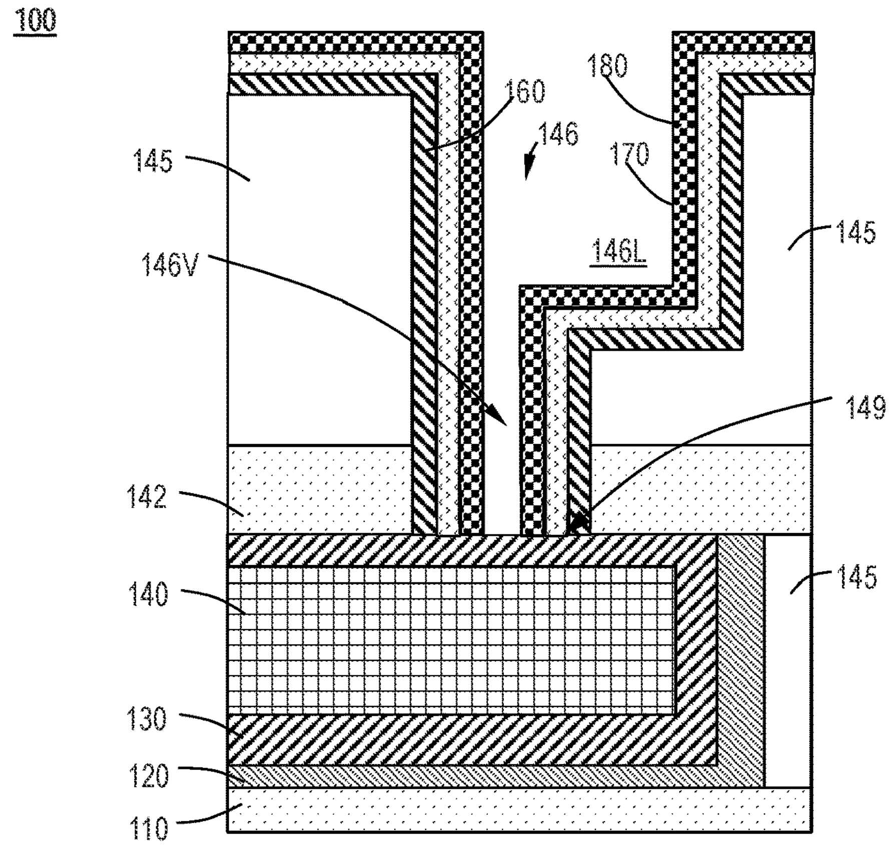
FIG. 1E illustrates removal of the passivation layer formed in FIG. 1A after formation of the optional second liner layer in FIG. 1D.

Referring to FIG. 1E, in one or more embodiments, the SAM 150 has been removed from the structure shown in FIG. 1D using the methods described herein. In one or more embodiments, removing the SAM 150 comprises a plasma treatment process comprising flowing one or more of hydrogen ($H_2$) or argon (Ar). In one or more embodiments, the plasma treatment process comprises increasing a density of the barrier layer 160. In one or more embodiments, a gap fill process comprises filling the gap 146 shown in FIG. 1E with one or more of copper (Cu) or cobalt (Co).

Figure 2A:
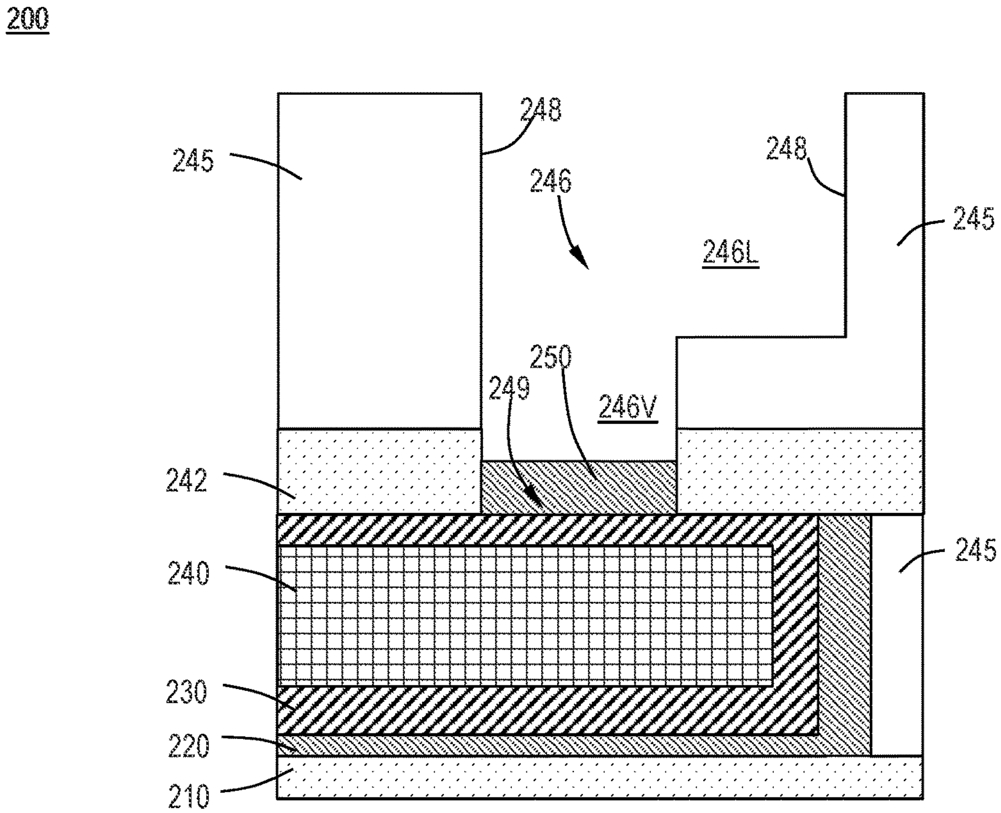
FIG. 2A illustrates a portion of a microelectronic device during a stage of manufacture in accordance with one or more embodiments of the disclosure having a first passivation layer formed on a bottom of a gap in accordance with one or more embodiments of the disclosure.
Figure 2B:
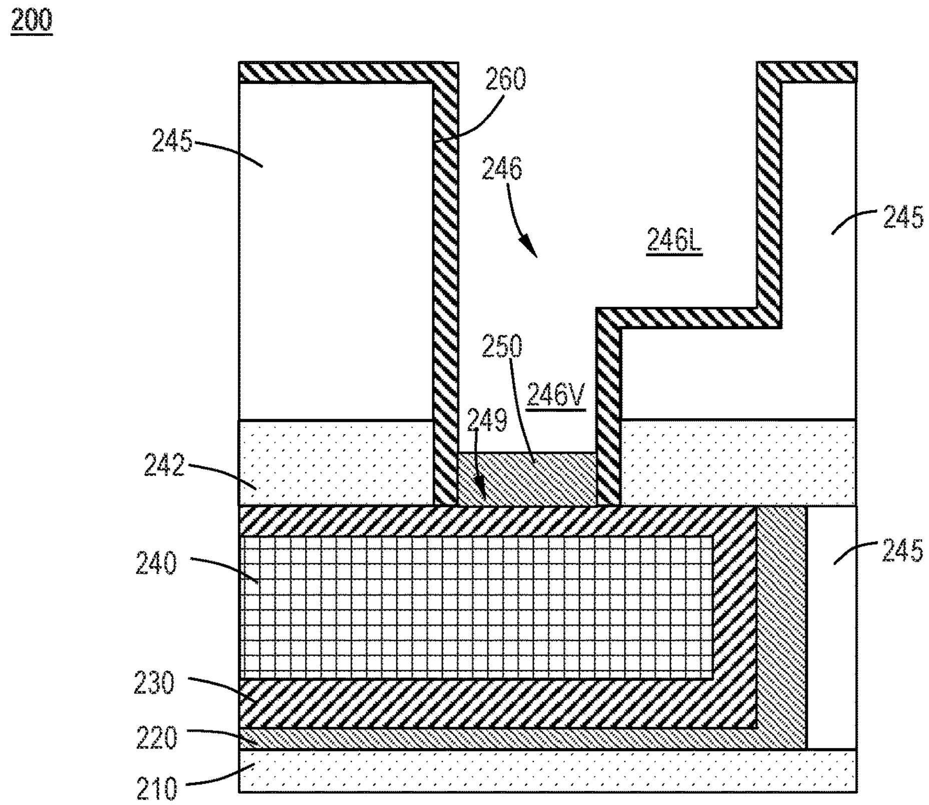
FIG. 2B illustrates a barrier layer formed on the gap in FIG. 2A.

Referring to FIGS. 2A and 2B, a portion of microelectronic device 200 is shown during various stages of manufacture according to an alternative embodiment of the disclosure. In one or more embodiments, the microelectronic device 200 comprises a substrate 210, a barrier layer 220 on the substrate 210, a metal liner 230 on the barrier layer 220, a conductive filled gap 240, an aluminum oxide etch stop layer 242, a dielectric layer 245 on the aluminum oxide etch stop layer 242, the dielectric layer 245 comprising at least one feature defining a gap 246 including sidewalls 248 and a bottom 249. In one or more embodiments, a first passivation layer (e.g., a first self-assembled monolayer (SAM)) 250 is formed on the bottom 249 of the gap.

In one or more embodiments, the features of the microelectronic devices illustrated in FIGS. 1A-1E and FIGS. 2A-2G have the same properties, including the materials, manufacturing methods, dimensions, etc. In one or more embodiments, the substrate 210, the barrier layer 220 on the substrate, the metal liner 230 on the barrier layer 220, the conductive filled gap 240, the aluminum oxide etch stop layer 242, and the dielectric layer 245 on the aluminum oxide etch stop layer 242 comprise at least one feature defining a gap 246 including sidewalls 248 and a bottom 249. The first SAM 250 is formed by flowing a hydrocarbon carried in argon (Ar) gas. In one or more embodiments, the first SAM 250 comprises an SAM. In one or more embodiments, the first SAM 250 is deposited on the dielectric layer 245.

Figure 2C:
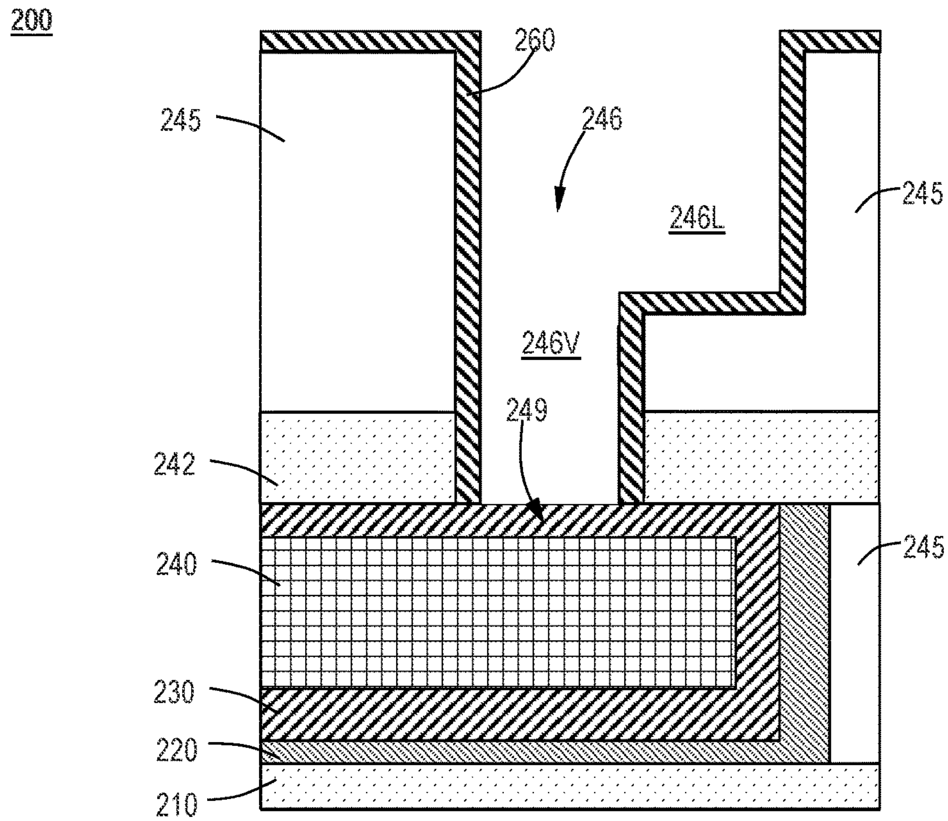
FIG. 2C illustrates removal of the passivation layer formed in FIG. 2A.

Referring to FIG. 2B, a barrier layer 260 is shown as formed on the first SAM 250 and on the sidewalls 248. In FIG. 2C, the first SAM 250 has been removed. In one or more embodiments, removing the first SAM 250 comprises a plasma treatment process comprising flowing one or more of hydrogen ($H_2$) or argon (Ar). In one or more embodiments, the plasma treatment process increases the density of the barrier layer 260.

Figure 2D:
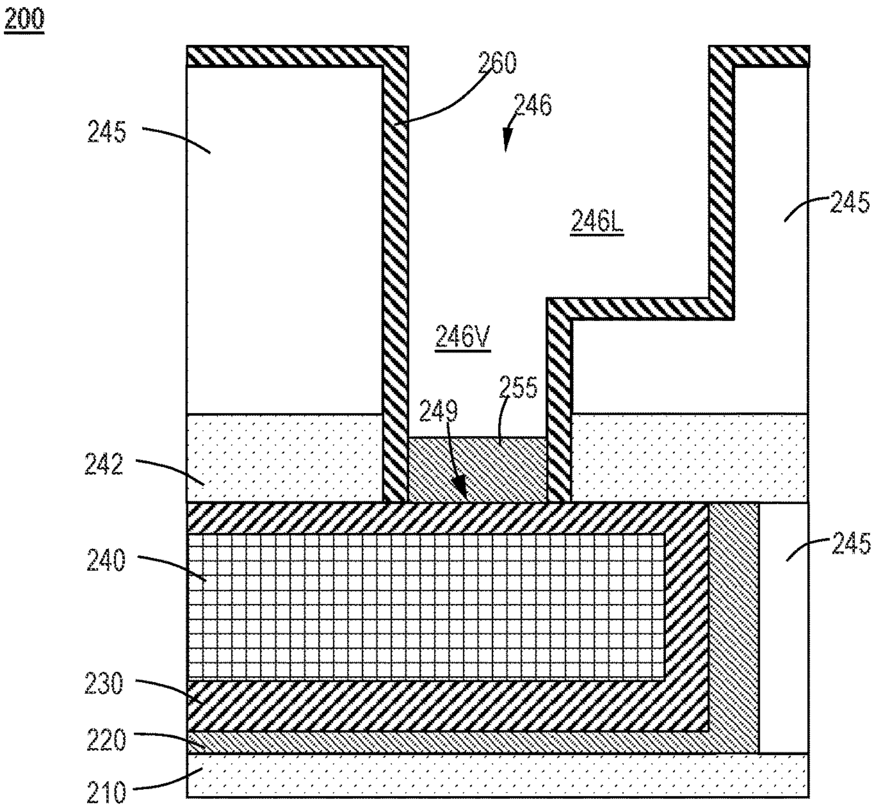
FIG. 2D illustrates a second passivation layer formed on the barrier layer formed in FIG. 2B.

Referring now to FIG. 2D, after removal of the first SAM 250, a second passivation layer (e.g., a second self-assembled monolayer (SAM)) 255 is shown as being formed on the bottom 249 of the gap, on the barrier layer 260, and the bottom 249 of the gap. In one or more embodiments, the first SAM 250 and the second SAM 255 are the same. In one or more embodiments, the first SAM 250 and the second SAM 255 are different.

In one or more embodiments, the second SAM 255 has a general formula I to XIX, wherein R, R', $R_1$, $R_2$, $R_3$, $R_4$, and $R_5$ are independently selected from hydrogen (H), alkyl, alkene, alkyne, and aryl, n is from 1 to 20, m is from 1 to 20, x is from 1 to 2, and y is from 1 to 2:

(I)

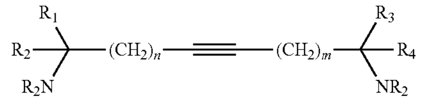

(II)

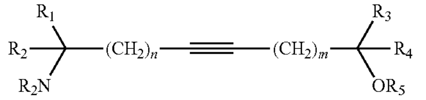

(III)

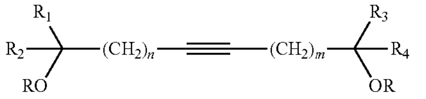

(IV)

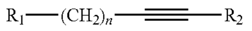

(V)

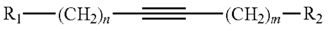

(VI)

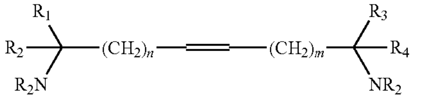

(VII)

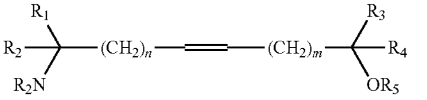

(VIII)

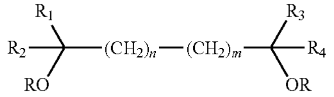

(IX)

$N\equiv C-R \quad C\equiv N-R$ (X)

$R_1-N=C=N-R_2$ (XI)

$R_2N-(CH_2)n-OR'$ (XII)

$-(CH_2)n-NR_2$

-continued (XIII)

$R_1$—S—$R_2$ (XIV)

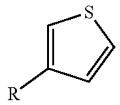

(XV)

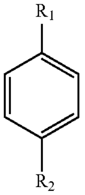

(XVI)

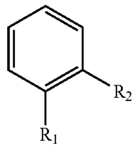

(XVII)

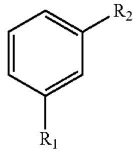

(XVIII)

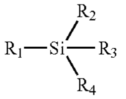

(XIX)

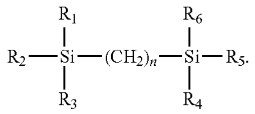

Figure 2E:
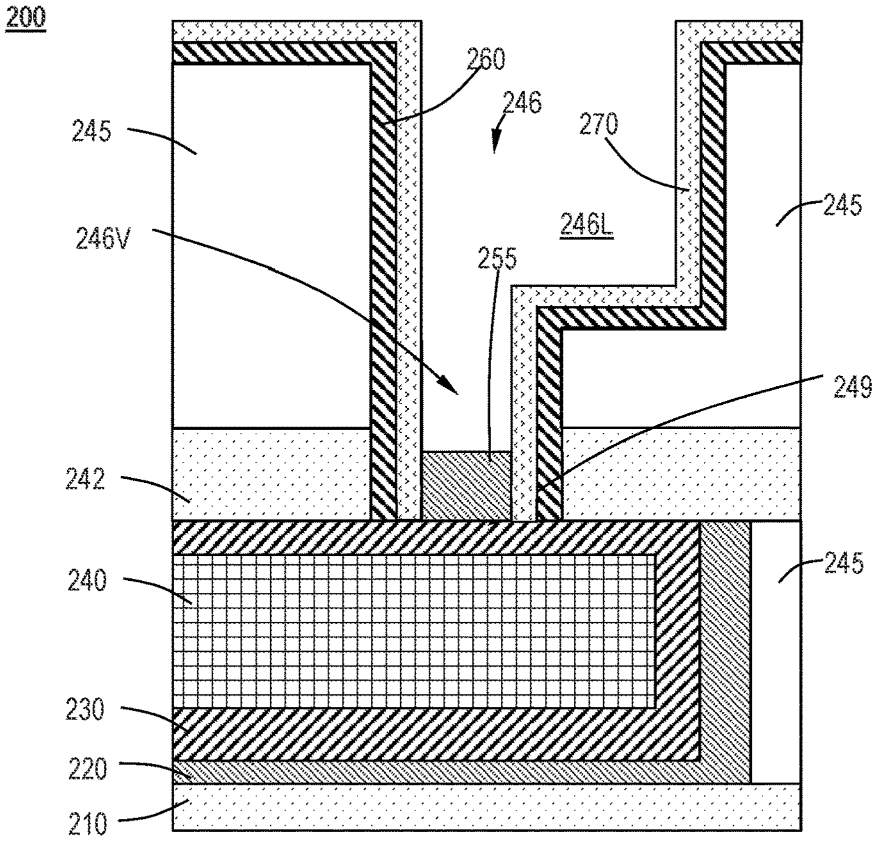
FIG. 2E illustrates a liner layer on the barrier layer formed in FIG. 2B.
Figure 2F:
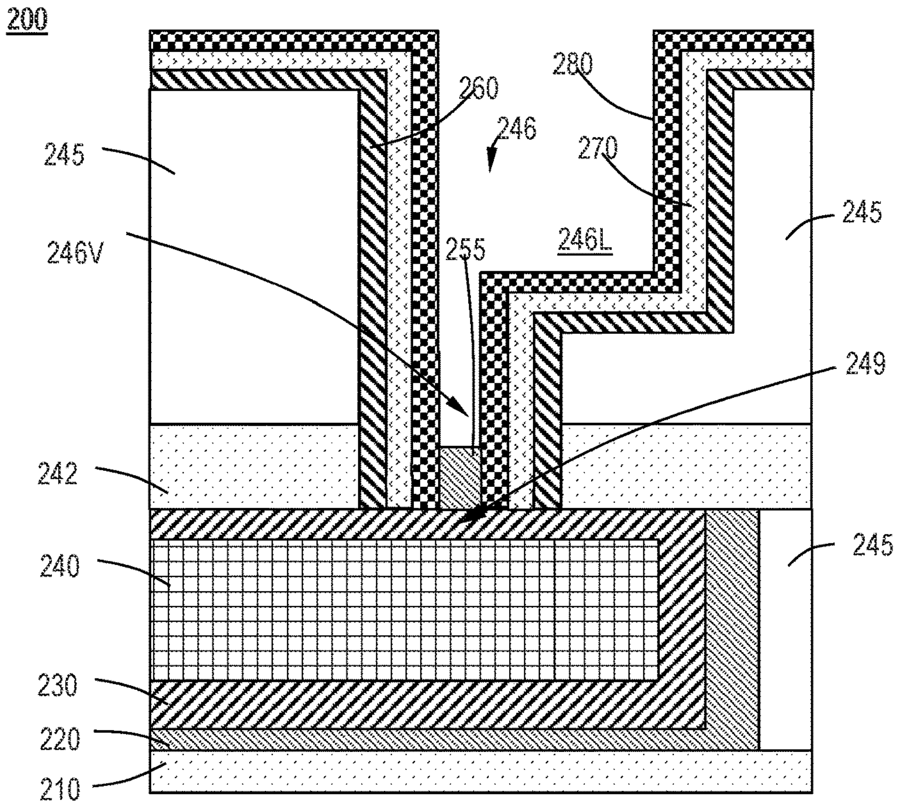
FIG. 2F illustrates a second liner layer formed on the liner layer formed in FIG. 2E.

Referring to FIG. 2E, a first metal liner 270 is shown as deposited on the barrier layer 260. Referring now to FIG. 2F, in one or more embodiments, an optional second metal liner 280 is shown as being formed on the first metal liner 270.

Figure 2G:
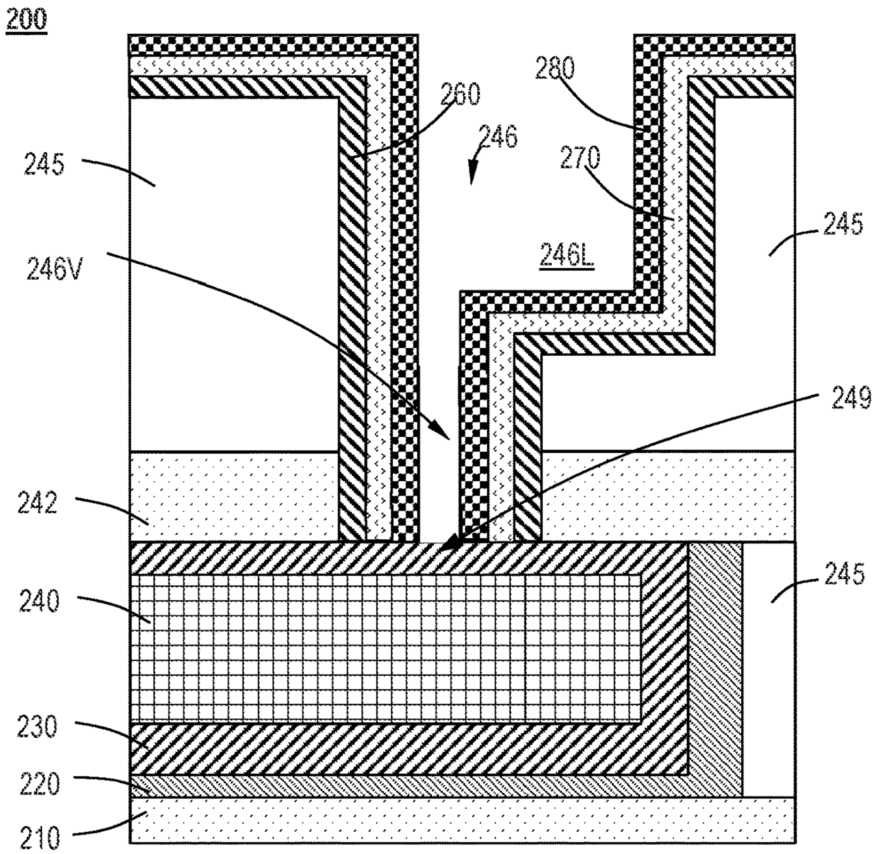
FIG. 2G illustrates the structure of FIG. 2F after removal of the second passivation layer.

Referring to FIG. 2G, the second SAM 255 has been removed. In one or more embodiments, the first SAM 250 and the second SAM 255 can be removed by the same process. In one or more embodiments, removing one or more of the first SAM and the second SAM comprises a plasma treatment process comprising flowing one or more of hydrogen ($H_2$) or argon (Ar). In one or more embodiments, the plasma treatment process increases the density of the barrier layer 260.

FIG. 3 illustrates a process flow diagram of a method 300 for forming a microelectronic device. FIG. 3 illustrates a method of forming any of the microelectronic devices of one or more embodiments shown in FIGS. 1A-1E. Referring to FIG. 3, the method 300 comprises, at operation 310, forming a dielectric layer on a substrate. The dielectric layer comprises at least one feature defining a gap including sidewalls and a bottom. At operation 320, the method 300 comprises selectively depositing a self-assembled monolayer (SAM) on the bottom of the gap. At operation 330, the method 300 comprises forming a barrier layer on the SAM. At operation 340, the method 300 comprises selectively depositing a metal liner on the barrier layer. At operation 340, in some embodiments, the metal liner is deposited at a thickness on the sidewalls that is greater than a thickness of the metal liner deposited on the bottom. In one or more embodiments, at operation 340, the metal liner is selectively deposited on the sidewalls, and not deposited on the bottom. At operation 350, the method 300 comprises removing the SAM after selectively depositing the metal liner on the barrier layer. At operation 360, the method 300 comprises performing a gap fill process on the metal liner. The gap fill process can include forming one or more of a via and a line to form an interconnect in the device.

FIG. 4 illustrates a process flow diagram of a method 400 for forming a microelectronic device. FIG. 4 illustrates a method of forming any of the microelectronic devices of one or more embodiments shown in FIGS. 2A-2G. Referring to FIG. 4, the method 400 comprises, at operation 410, forming a dielectric layer on a substrate. The dielectric layer comprises at least one feature defining a gap including sidewalls and a bottom. At operation 420, the method 400 comprises selectively depositing a first self-assembled monolayer (SAM) on the bottom of the gap. At operation 430, the method 400 comprises forming a barrier layer on the first SAM. At operation 440, the method 400 comprises removing the first SAM after forming the barrier layer. At operation 450, the method 400 comprises selectively depositing a second self-assembled monolayer (SAM) on the barrier layer after removing the first SAM.

At operation 460, the method 400 comprises selectively depositing a metal liner on the barrier layer. At operation 460, in some embodiments, the metal liner is deposited at a thickness on the sidewalls that is greater than a thickness of the metal liner deposited on the bottom. In one or more embodiments, at operation 460, the metal liner is selectively deposited on the sidewalls, and not deposited on the bottom. At operation 470, the method 400 comprises removing the second SAM after selectively depositing the metal liner on the barrier layer. At operation 480, the method 400 comprises performing a gap fill process on the metal liner. The gap fill process can include forming one or more of a via and a line to form an interconnect in the device.

In one or more embodiments, the methods described herein comprise an optional post-processing operation. The optional post-processing operation can be, for example, a process to modify film properties (e.g., annealing) or a further film deposition process (e.g., additional ALD or CVD processes) to grow additional films. In some embodiments, the optional post-processing operation can be a process that modifies a property of the deposited film. In some embodiments, the optional post-processing operation comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the metal liner layers.

In some embodiments, the substrate is moved from a first chamber to a separate, next chamber for further processing. The substrate can be moved directly from the first chamber to the separate processing chamber, or the substrate can be moved from the first chamber to one or more transfer chambers, and then moved to the separate processing chamber. In some embodiments, the deposition of the barrier layer and the dopant film can be done in a single chamber, and then the post-processing can be performed in a separate chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. However, the exact arrangement and combination of chambers may be altered for purposes of performing specific steps of a process as described herein. Other processing chambers which may be used include, but are not limited to, cyclic deposition including a deposition step, and an annealing or treatment step, atomic layer deposition (ALD), chemical vapor deposition (CVD), physical vapor deposition (PVD), etch, pre-clean, chemical clean, plasma nitridation, degas, orientation, hydroxylation, and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Another aspect of the disclosure pertains to a non-transitory computer readable medium including instructions, that, when executed by a controller of a processing system, causes the processing system to perform operations of the methods described herein. In one embodiment, a non-transitory computer readable medium including instructions, that, when executed by a controller of a processing system, causes the processing system to perform operations of the methods described herein with respect to FIGS. 1A-E, 2A-G, 3 and 4.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a microelectronic device, the method comprising:

forming a dielectric layer on a substrate, the dielectric layer comprising at least one feature defining a gap including sidewalls and a bottom;

selectively depositing a self-assembled monolayer (SAM) on the bottom of the gap and not on the sidewalls, the SAM selected from the group consisting of N,N,N',N'-tetramethyl ethylenediamine, and N,N-dimethylhexylamine;

forming a barrier layer on the sidewalls and not on the bottom;

selectively depositing a metal liner on the barrier layer on the sidewalls, the metal liner being deposited at a thickness on the sidewalls that is greater than a thickness of the metal liner deposited on the bottom;

removing the SAM after selectively depositing the metal liner on the barrier layer; and performing a gap fill process on the metal liner.

2. The method of claim 1, wherein selectively depositing the SAM comprises exposing the bottom of the gap to the SAM carried in argon (Ar) gas.

3. The method of claim 1, wherein the metal liner is selectively deposited on the sidewalls of the microelectronic device.

4. The method of claim 3, wherein the metal liner comprises one or more of ruthenium (Ru), cobalt (cobalt), molybdenum (Mo), and tantalum (Ta).

5. The method of claim 3, wherein when the metal liner comprises a single layer of ruthenium (Ru) selectively deposited on the sidewall, the thickness of the metal liner thickness on the bottom is less than 10 Angstroms.

6. The method of claim 5, wherein the selective ruthenium (Ru) deposition on the sidewall comprises a cyclic deposition process using a ruthenium (Ru) precursor carried by an argon (Ar) gas to form a deposited ruthenium layer.

7. The method of claim 6, wherein the cyclic deposition process further comprises annealing the deposited ruthenium layer while flowing hydrogen ($H_2$) and annealing the deposited ruthenium layer.

8. The method of claim 7, wherein the cyclic deposition process is performed in a substrate processing chamber at a first pressure to form the deposited ruthenium layer, and annealing the deposited ruthenium layer is performed while the substrate processing chamber is at a second pressure that is greater than the first pressure.

9. The method of claim 1, wherein removing the SAM comprises a plasma treatment process comprising flowing one or more of hydrogen ($H_2$) or argon (Ar) and the plasma treatment process comprises increasing a density of the barrier layer.

10. The method of claim 1, wherein the gap fill process comprises filling the gap with one or more of copper (Cu) or cobalt (Co).

11. The method of claim 1, wherein forming the microelectronic device reduces a resistance of a via by at least 20% as compared to a resistance of a via in a microelectronic device where a metal liner is not selectively deposited.

12. A method of forming a microelectronic device, the method comprising:

forming a dielectric layer on a substrate, the dielectric layer comprising at least one feature defining a gap including sidewalls and a bottom;

selectively depositing a first self-assembled monolayer (SAM) on the bottom of the gap and not on the sidewalls, the first SAM selected from the group consisting of N,N,N',N'-tetraethyl ethylenediamine, N,N-dimethylhexylamine, 3,5-dimethyl pyrazole, and dimethyl acetylenedicarboxylate;

forming a barrier layer on the sidewalls and not on the bottom;

removing the first SAM after forming the barrier layer on the sidewalls;

selectively depositing a second self-assembled monolayer (SAM) on the bottom of the gap and not on the barrier layer, wherein the second SAM is selected from the group consisting of N,N,N',N'-tetramethyl ethylenediamine, N,N-dimethylhexylamine, 3,5-dimethyl pyrazole, and dimethyl acetylenedicarboxylate;

selectively depositing a metal liner on the barrier layer on the sidewalls, the metal liner being deposited at a thickness on the sidewalls that is greater than a thickness of the metal liner deposited on the bottom;

removing the second SAM after selectively depositing the metal liner on the barrier layer; and performing a gap fill process on the metal liner.

13. The method of claim 12, wherein the second SAM is selected from the group consisting of 3,5-dimethyl pyrazole and dimethyl acetylenedicarboxylate.

14. The method of claim 12, wherein the selective deposition of the metal liner on the barrier layer comprises a cyclic deposition process followed by annealing the deposited metal liner while flowing hydrogen ($H_2$).

15. The method of claim 12, wherein the first SAM is selected from the group consisting of N,N,N',N'-tetramethyl ethylenediamine and N,N-dimethylhexylamine.

* * * * *